(12) United States Patent
Kanai et al.

(10) Patent No.: US 10,256,169 B2
(45) Date of Patent: Apr. 9, 2019

(54) SEMICONDUCTOR DEVICE

(71) Applicant: Fuji Electric Co., Ltd., Kawasaki-shi, Kanagawa (JP)

(72) Inventors: Naoyuki Kanai, Kawasaki (JP); Tatsuhiko Asai, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 15/445,421

(22) Filed: Feb. 28, 2017

(65) Prior Publication Data

US 2017/0278771 A1     Sep. 28, 2017

(30) Foreign Application Priority Data

Mar. 24, 2016   (JP) .................................. 2016-060326
Oct. 17, 2016   (JP) .................................. 2016-203590

(51) Int. Cl.
*H01L 23/373*     (2006.01)
*H01L 21/48*      (2006.01)
(Continued)

(52) U.S. Cl.
CPC ...... *H01L 23/3735* (2013.01); *H01L 21/4803* (2013.01); *H01L 21/52* (2013.01); *H01L 21/565* (2013.01); *H01L 23/053* (2013.01); *H01L 23/08* (2013.01); *H01L 23/18* (2013.01); *H01L 23/295* (2013.01); *H01L 23/3121* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 2224/2912* (2013.01); *H01L 2224/29111* (2013.01); *H01L 2224/29139* (2013.01); *H01L 2224/29147* (2013.01); *H01L 2224/29155* (2013.01); *H01L 2224/32245* (2013.01); *H01L 2224/45124* (2013.01); *H01L 2224/45147* (2013.01); *H01L 2224/48091* (2013.01); *H01L 2224/48106* (2013.01); *H01L 2224/48247* (2013.01); *H01L 2224/73265* (2013.01); *H01L 2224/92247* (2013.01);
(Continued)

(58) Field of Classification Search
CPC ........ H01L 23/29; H01L 23/295; H01L 23/31
See application file for complete search history.

(56) References Cited

U.S. PATENT DOCUMENTS 4,523,371 A * 6/1985 Wakashima ............ B29C 65/08
                                                            156/309.9
4,617,584 A * 10/1986 Ikeya .................. C08G 59/621
                                                                257/793
(Continued)

FOREIGN PATENT DOCUMENTS

JP   2012188480 A   10/2012
JP   2015054898 A    3/2015

*Primary Examiner* — Wael M Fahmy
*Assistant Examiner* — Sarah K Salerno
(74) *Attorney, Agent, or Firm* — Lerner, David, Littenberg, Krumholz & Mentlik, LLP (57) ABSTRACT

A highly-reliable semiconductor device has improved adhesion between a sealing material and a sealed metal member and/or a case member. In some implementations, the semiconductor device includes: a laminated substrate on which a semiconductor element is mounted; and a sealing material. In some implementations, the sealing material contains an epoxy base resin, a curing agent, and a phosphonic acid.

20 Claims, 2 Drawing Sheets

(51) Int. Cl.
*H01L 21/52* (2006.01)
*H01L 21/56* (2006.01)
*H01L 23/053* (2006.01)
*H01L 23/08* (2006.01)
*H01L 23/18* (2006.01)
*H01L 23/29* (2006.01)
*H01L 23/31* (2006.01)
*H01L 23/00* (2006.01)

(52) U.S. Cl.
CPC .. *H01L 2924/014* (2013.01); *H01L 2924/067* (2013.01); *H01L 2924/0665* (2013.01); *H01L 2924/0705* (2013.01); *H01L 2924/1033* (2013.01); *H01L 2924/10253* (2013.01); *H01L 2924/10272* (2013.01); *H01L 2924/12032* (2013.01); *H01L 2924/13055* (2013.01); *H01L 2924/1579* (2013.01); *H01L 2924/15747* (2013.01); *H01L 2924/186* (2013.01)

(56) References Cited

U.S. PATENT DOCUMENTS

| | | | |
|---|---|---|---|
| 2004/0102529 A1* | 5/2004 | Campbell | B82Y 30/00 516/79 |
| 2014/0031478 A1* | 1/2014 | Lu | C08G 18/4277 524/425 |
| 2015/0037575 A1* | 2/2015 | Sakaguchi | H05K 7/20481 428/354 |

* cited by examiner

SEMICONDUCTOR DEVICE

CROSS-REFERENCE TO RELATED APPLICATIONS

This application claims priority from Japanese Patent Application No. 2016-060326, filed on Mar. 24, 2016, and Japanese Patent Application No. 2016-203590, filed on Oct. 17, 2016, the disclosures of which are hereby incorporated by reference.

TECHNICAL FIELD

The present invention relates to a semiconductor device. The present invention relates particularly to a highly-reliable semiconductor in which adhesion between a metal member and a sealing material and adhesion between a case and the sealing material are improved.

BACKGROUND

Power semiconductor devices are widely used in fields requiring efficient electric power conversion. Fields in renewable energy have been attracting attention in recent years, such as photovoltaic generation and wind power generation; an in-vehicle field such as hybrid vehicles and electric vehicles; and a railroad field such as trains. The power semiconductor device includes switching elements and diodes that are incorporated therein. For the elements, Si (silicon) semiconductors have been conventionally used, but in recent years, wide band gap semiconductors such as SiC (silicon carbide) semiconductors have begun to be used. The SiC semiconductor has characteristics such as higher breakdown voltage, higher heat resistance and a lower loss than those of the Si semiconductor. The use of a SiC semiconductor in a power semiconductor device makes it possible to decrease the size of the power semiconductor device, and to reduce the loss in the device. Meanwhile, Si semiconductors are still widely used in power semiconductor devices. In that case, a power semiconductor element is sealed with a sealing material including epoxy resin which has good moisture resistance, heat resistance and mechanical properties.

However, the epoxy resin has a problem of insufficient adhesion to a resin case and/or metal members such as an electrode of a power semiconductor element, a conductive plate, a wire and pins used in a powered semiconductor device. Accordingly, the epoxy resin may have a risk of reducing the reliability of the power semiconductor device due to the insufficient adhesion.

An epoxy resin for sealing a semiconductor device has been known which contains, as an adhesion imparting agent, a nitrilotris(methylene)phosphonic acid salt which is a solid at normal temperature (see Patent Document 1, for example). Since, however, the organic filler of the phosphonic acid salt is mixed in the epoxy resin in this technique, this technique has disadvantages of insufficient adhesion strength because the phosphonic acid is unlikely to react with the base material and the epoxy resin, and insufficient long-term reliability because the cations of the phosphonic acid salt react with the epoxy resin, for example.

BRIEF SUMMARY

The present invention has been made with the above problems taken into consideration. An object of the present invention is to provide a highly-reliable semiconductor device in which adhesion between an epoxy resin and a metal member and/or a case member used in the semiconductor device is increased.

The inventors have found that combination of a phosphonic acid with an epoxy resin to form a sealing material increases adhesion between the epoxy resin and a metal member and/or a case member while allowing the epoxy resin to maintain its intrinsic excellent properties, and have completed the invention. One aspect of the disclosure provides a semiconductor device including: a laminated substrate on which a semiconductor element is mounted; and a sealing material, in which the sealing material contains an epoxy base resin, a curing agent and a phosphonic acid.

In some implementations, the semiconductor device further includes a resin case. In some implementations, the resin case is a surface-treated resin case. In some implementations, the resin case contains a polyphenylene sulfide resin. In some implementations, a layer of the phosphonic acid is formed on a surface of the resin case. In some implementations, a layer of the phosphonic acid is formed on a surface of a sealed member including the semiconductor element and the laminated substrate. In some implementations, the phosphonic acid is substantially uniformly mixed in the sealing material. In some implementations, the phosphonic acid is a phosphonic acid containing a carboxyl group. In some implementations, the phosphonic acid is a phosphonic acid containing an amino group. In some implementations, the epoxy base resin is an alicyclic epoxy and/or an aliphatic epoxy. In some implementations, the sealing material further contains an inorganic filler, and/or the curing agent is an acid anhydride curing agent. In some implementations, the semiconductor element includes one or more of a Si semiconductor element, a SiC semiconductor element, or a GaN semiconductor element.

Another aspect of the disclosure provides a manufacturing method of a semiconductor device, including the steps of: mounting a semiconductor element on a laminated substrate; forming a phosphonic acid layer on a surface of a member including the laminated substrate and the semiconductor element; and bringing an epoxy resin composition containing an epoxy base resin and a curing agent into contact with the phosphonic acid layer.

Yet another aspect of the disclosure provides a manufacturing method of a semiconductor device, including the steps of: mounting a semiconductor element on a laminated substrate; assembling a case with the laminated substrate on which the semiconductor element is mounted; forming a phosphonic acid layer at least on a surface of the case; and bringing an epoxy resin composition containing an epoxy base resin and a curing agent into contact with the phosphonic acid layer. In some implementations, the manufacturing method further includes the step of surface-treating the surface of the case before the step of forming the phosphonic acid layer.

Yet another aspect of the disclosure provides a manufacturing method of a semiconductor device, including the steps of: mounting a semiconductor element on a laminated substrate; and sealing a member, including the laminated substrate and the semiconductor element, with a sealing material containing an epoxy base resin, a curing agent and a phosphonic acid. In some implementations, the manufacturing method further includes the step of assembling a case on the laminated substrate on which the semiconductor element is mounted.

Yet another aspect of the disclosure provides a resin composition for sealing an electronic device, including an epoxy resin, a curing agent and a phosphonic acid. In some implementations, an electronic device is sealed with the resin composition.

In some implementations, addition of a phosphonic acid to a sealing material increases adhesion between a metal member and/or a case and the epoxy resin. Thus, the present invention can provide the highly-reliable semiconductor device.

DETAILED DESCRIPTION

Referring to the drawings, descriptions will be provided hereinbelow for embodiments of the present invention. Nevertheless, the present invention is not limited to the below-described embodiments.

First Embodiment: Semiconductor Device

A first embodiment of the present invention is a semiconductor device which includes: a laminated substrate on which a semiconductor element is mounted; a sealing material; and optionally a case. The sealing material contains an epoxy resin, a curing agent, and a phosphonic acid. The embodiment of the present invention can be roughly classified into: a first mode in which the phosphonic acid locally exists on the surface of a member including the semiconductor element and a laminated substrate, and forms a phosphonic acid layer; a third mode in which the phosphonic acid locally exists on the surface of the case, and forms a phosphonic acid layer; and a second and fourth modes in which the phosphonic acid is substantially evenly distributed throughout the sealing material. Incidentally, in all the modes, the phosphonic acid includes reactive species of the phosphonic acid (various compounds derived from the phosphonic acid) which are substances formed by chemical reactions, in the sealing material, of the phosphonic acid and any of the case and/or the member including the semiconductor element and the laminated substrate, and other compounds containing an epoxy base resin or the like to form the sealing material. The following descriptions will be provided for each mode of the embodiment of the present invention.

First Mode

Figure 1:
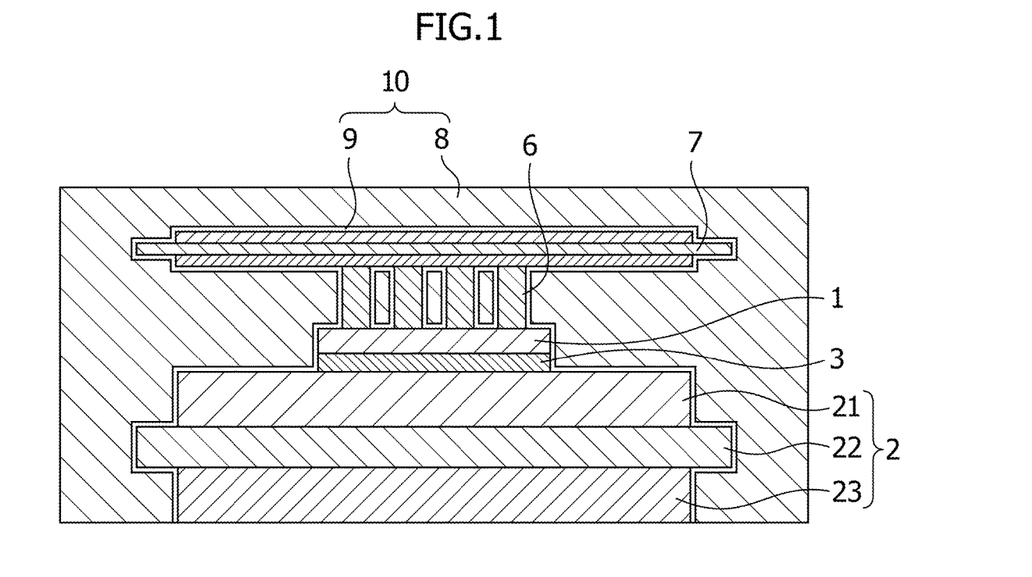
FIG. 1 is a conceptual diagram illustrating a cross-sectional structure of a power module of a first mode of a semiconductor device according to the present invention.

FIG. 1 is a conceptual cross-section diagram of a power module which is an example of the semiconductor device of the first mode of the present invention. In FIG. 1, the semiconductor element 1 is mounted on the laminated substrate 2 with a bonding layer 3 of solder or the like interposed in between. An implant-type printed circuit board 7 including implant pins 6 is attached to the upper surface of the semiconductor element 1 with the bonding layer 3 of solder or the like interposed in between. A phosphonic acid layer 9 is formed on surfaces of the laminated substrate 2, the semiconductor element 1, the implant pins 6 and the printed circuit board 7. A resin layer 8 is provided bordering the phosphonic acid layer 9. The phosphonic acid layer 9 and the resin layer 8 jointly form a sealing material 10. Incidentally, in the specification, the upper and lower surfaces are terms used to indicate relative directions in the drawings for explanatory purposes. These terms are not intended to denote which side of the semiconductor module is the "upper" and which is the "lower" when it is in use. Furthermore, what is referred to as a sealed member in the specification to go on below is a member which includes the semiconductor element 1 and the laminated substrate 2, and which is insulated by and sealed with a sealing material in a usual sealing mode. In the illustrated embodiment, the sealed member includes the semiconductor element 1, the laminated substrate 2, the bonding layer 3, the implant pins 6 and the printed circuit board 7.

The semiconductor element 1 is a power chip such as an IGBT, a MOS or a diode chip. Various Si devices, SiC devices, GaN devices and the like may be used as the semiconductor element 1. Alternatively, some of these devices may be used in combination as the semiconductor element 1. For example, a hybrid module using a Si—IGBT and a SiC—SBD may be used as the semiconductor element 1. The number of semiconductor elements 1 mounted thereon is not limited to the number suggested by the illustration of the mode. Multiple semiconductor elements 1 may be mounted thereon.

The laminated substrate 2 includes: an insulating substrate 22; a second conductive plate 21 formed on one surface of the insulating substrate 22; and a first conductive plate 23 formed on the other surface of the insulating substrate 22. A material with good electrical-insulating and heat-conducting properties is usable for the insulating substrate 22. Examples of the material of the insulating substrate 22 include $Al_2O_3$, AlN and SiN. Particularly when the insulating substrate 22 is used in a high breakdown-voltage semiconductor device, it is desirable that the electrical insulating property and the thermal conductivity be compatible with each other. Although AlN and SiN may be used as the material, the material is not limited to these examples. A metal material with good workability, such as Cu and Al, is usable for the second conductive plate 21 and the first conductive plate 23. In addition, for the purposes of anti-corrosion, a Cu or Al metal material plated with Ni or the like may be used for the second conductive plate 21 and the first conductive plate 23. Examples of a method of arranging the conductive plates 21, 23 on the insulating substrate 22 include a direct copper bonding method and an active metal brazing method.

The bonding layer 3 may be formed from lead-free solder. Examples of usable lead-free solder include a Sn—Ag—Cu-based solder, a Sn—Sb-based solder, a Sn—Sb—Ag-based solder, a Sn—Cu-based solder, a Sn—Sb—Ag—Cu-based solder, a Sn—Cu—Ni-based solder, and a Sn—Ag-based solder. Nevertheless, the lead-free solder usable for the bonding layer 3 is not limited to these examples. Instead, lead-containing solder may be used for the bonding layer 3.

A polyimide or epoxy film substrate with a conductive layer of Cu, Al or the like formed thereon is usable as the printed circuit board 7. Copper pins made of copper are usable as the implant pins 6. Cu or Al plated with Ni or the like for the anti-corrosion purposes may be used for the conductive layer of the printed circuit board 7, and the implant pins 6. The printed circuit board 7 and the implant pins 6 electrically connect one part to another part of the semiconductor element 1, or the semiconductor element 1 to the laminated substrate 2. The implant pins 6 may be bonded to the laminated substrate 2 or the semiconductor element 1 using the above-described solder bonding layer 3. Furthermore, although not illustrated, when the implant pins 6 are drawn out from the top of the laminated substrate 2 to the outside of the sealing material 10, the implant pins 6 can be used as external connecting terminals.

In the first mode, the phosphonic acid layer 9 is formed on the surface of the sealed member which includes the semiconductor 1, the laminated substrate 2, the implant pins 6 and the printed circuit board 7, and which may additionally include other terminals, not shown, and the like. The state in which the phosphonic acid layer 9 is formed means a state in which the phosphonic acid layer 9 is attached to all or part of the surface of the sealed member, or preferably is bonded to the surface of the sealed member after the formation by applying the phosphonic acid to the surface of the sealed member; or a state in which hydroxyl group(s) of the phosphonic acid being removed by a dehydration reaction during or after the formation of the phosphonic acid layer 9, and the phosphonic acid layer 9 is bonded to the surface of the sealed member. Moreover, the phosphonic acid mentioned herein includes phosphonic acids existing as reaction products of reactions which occurs when the phosphonic acid layer 9 contacts the resin layer 8, to be described later, and which proceeds with chemical compounds and the like in the resin layer 8, that is, the epoxy base resin and inorganic fillers which may optionally be included. Nevertheless, there are cases in which the phosphoric acid remains as it is.

It should be noted that a solution obtained by dissolving the phosphonic acid into a solvent may be applied to the surface of the sealed member. Since the phosphonic acid is a low-molecular compound, the phosphonic acid is advantageous over a silane coupling agent and the like in terms of ease of forming a uniform layer. The existence of the phosphonic acid layer 9 in the semiconductor device can be detected, for example, by analyzing the interface between the sealed member and the resin layer, for example, using X-ray photoelectron spectroscopy or transmission electron microscopy.

In the present invention, the phosphonic acid is defined as an organophosphorus compound containing at least one phosphonyl group, $-P(=O)(OH)_2$. It should be noted that phosphonic acid salts are not desirable for the present invention. This is because it is impossible to supply acids ($H^+$) to the surface of the sealed member. A phosphonic acid containing an amino group and/or a carboxyl group is usable as the phosphonic acid of the present invention. Examples of the phosphonic acid containing an amino group include (1-aminoethyl) phosphonic acid, (aminomethyl) phosphonic acid, (4-aminobenzyl) phosphonic acid, (3-aminophenyl) phosphonic acid, (4-aminophenyl) phosphonic acid, 4-amino-1-hydroxybutane-1, and 1-diphosphonic acid. Examples of the phosphonic acid containing a carboxyl group include (3-carboxypropyl) phosphonic acid, (2-carboxyethyl) phosphonic acid, carboxymethyl phosphonic acid, (5-carboxypenthyl) phosphonic acid, 6-phosphonohexan acid, 11-phosphonoundecanoic acid, 16-phosphonohexadecan acid, glycine-N,N-bis(methylenephosphonic acid). Examples of the phosphonic acid containing both an amino group and a carboxyl group include 2-amino-6-phosphonohexan acid.

The phosphonic acid layer 9 may be made of one type of phosphonic acid, or two or more types of phosphonic acids. When two or more different types of phosphonic acids are used to form the phosphonic acid layer 9, there are cases in which it is desirable that carboxyl group-containing phosphonic acids be combined together or amino group-containing phosphonic acids be combined together, and it is desirable that a carboxyl group-containing phosphonic acid and an amino group-containing phosphonic acid not be combined together. This will be described in detail later. No specific restriction is imposed on the thickness of the phosphonic acid layer 9. Although the thickness depends on the type of phosphonic acids used and the concentration of phosphonic acid solution used in the manufacturing method described later, a monomolecular film formed as the phosphonic acid layer 9 may be, for example, at a couple of nanometers to tens of nanometers in thickness, and preferably approximately 2 nanometers to 50 nanometers in thickness.

The resin layer 8 may be made of an epoxy resin composition which contains the epoxy base resin and the curing agent, and which may further contain inorganic fillers and other additives that are freely selected. An aliphatic epoxy resin or an alicyclic epoxy resin is usable as the epoxy base resin.

In the present invention, the aliphatic epoxy resin is defined as an epoxy compound in which an epoxide group is directly bonded to the carbon atom (atoms) and the carbon atom (atoms) are contained in aliphatic hydrocarbon. Accordingly, even a compound having a skeletal formula that includes an aromatic ring is classified as an "aliphatic epoxy resin" category, as long as the compound satisfies the foregoing condition. Examples of the aliphatic epoxy resin include a bisphenol A epoxy resin, a bisphenol F epoxy resin, a bisphenol AD epoxy resin, a biphenyl epoxy resin, a cresol novolac epoxy resin, and a polyfunctional epoxy resin having at least three functions. Nevertheless, the aliphatic epoxy resin is not limited to these examples. Resins listed as examples of the aliphatic epoxy resins may be used singly or in combination by mixing two or more types thereof together.

In the present invention, the alicyclic epoxy resin is defined as an epoxy compound in which two carbon atoms contained in an epoxide group form an alicyclic compound. Examples of the alicyclic epoxy resin include a monofunctional epoxy resin, a bifunctional epoxy resin, and a polyfunctional epoxy resin having at least three functions. Nevertheless, the alicyclic epoxy resin is not limited to these examples. Resins listed as examples of the alicyclic epoxy resins may also be used singly or in combination by mixing two or more types of them together.

No specific restriction is imposed on the curing agent, as long as the curing agent can harden by its reaction with the epoxy base resin. However, it is desirable that an acid anhydride curing agent be used as the curing agent. An aromatic acid anhydride can be used as an example of the acid anhydride curing agent. Specific examples of the aromatic acid anhydride include phthalic anhydride, pyromellitic dianhydride, and trimellitic anhydride. In addition, a cyclic aliphatic acid anhydride can be used as an example of the acid anhydride curing agent. Specific examples of the cyclic aliphatic acid anhydride include tetrahydrophthalic anhydride, methyl tetrahydrophthalic anhydride, hexahydrophthalic anhydride, methyl hexahydrophthalic anhydride, and methyl nadic anhydride. Furthermore, an aliphatic acid anhydride can be used as an example of the acid anhydride curing agent. Specific examples of the aliphatic acid anhydride include succinic anhydride, polyadipic anhydride, poly(sebacic anhydride), and polyazelaic anhydride. As for the amount of the curing agent to be mixed, it is desirable that 50 to 170 parts by mass of the curing agent be mixed with 100 parts by mass of the epoxy base resin. It is more desirable that 80 to 150 parts by mass of the curing agent be mixed with 100 parts by mass of the epoxy base resin. In a case in which less than 50 parts by mass of the curing agent is mixed with 100 parts by mass of the epoxy base resin, there is the likelihood that the glass transition temperature will decrease because of insufficient crosslinking. In a case in which more than 170 parts by mass of the curing agent is mixed with 100 parts by mass of the epoxy base resin, there is the likelihood that the moisture resistance performance and the heat resistance stability deteriorate while the high-heat deformation temperature decreases.

As an optional component, a curing accelerator may be added to the epoxy resin composition. As curing accelerators, imidazoles, derivatives of imidazoles, tertiary amines, boric acid esters, Lewis acids, organometallic compounds, organic acid metal salts and the like may be mixed into the epoxy resin composition depending on the necessity. As for the amount of the curing accelerator to be added, it is desirable that 0.01 to 50 parts by mass of the curing accelerator be added to 100 parts by mass of the epoxy base resin. It is more desirable that 0.1 to 20 parts by mass of the curing accelerator be added to 100 parts by mass of the epoxy base resin.

In addition, examples of the inorganic fillers which, as an optional component, may be contained in the epoxy resin composition include, for example, molten silica, silica, alumina, aluminum hydroxide, titania, zirconia, aluminum nitride, talc, clay, mica, and glass fiber. Nevertheless, the inorganic fillers are not limited to these examples. Use of these inorganic fillers makes it possible to increase the thermal conductivity of the hardened material, and to decrease the coefficient of thermal expansion. These inorganic fillers may be used singly or in combination by mixing two or more types of them together. Furthermore, these inorganic fillers may be micro-fillers or nano-fillers. Two or more types of inorganic fillers which are of different types and/or have different particle sizes may be used to be mixed into the epoxy resin composition. In particular, it is desirable that the inorganic fillers with an average particle diameter of approximately 0.2 to 20 μm be used. As for the amount of the inorganic fillers to be added, it is desirable that 100 to 600 parts by mass of the inorganic fillers be added to 100 parts by mass of a combination of the epoxy base resin and the curing agent. It is more desirable that 200 to 400 parts by mass of the inorganic fillers be added to 100 parts by mass of the combination thereof. In a case in which less than 100 parts by mass of the inorganic fillers is added to 100 parts by mass of the combination thereof, there is likelihood that the coefficient of thermal expansion of the sealing material increases to an extent that the sealing material peelings and cracks. On the other hand, in a case in which more than 600 parts by mass of the inorganic fillers is added to 100 parts by mass of the combination thereof, there is the likelihood that the viscosity of the epoxy resin composition increases to worsen the extrusion moldability.

Moreover, optional additives may be contained in the epoxy resin composition as long as the additive does not inhibit the properties of the epoxy resin composition. Examples of the additives include: flame retardants, pigments for coloring resins, plasticizers, and silicone elastomers for improving crack resistance. Nevertheless, the additives are not limited to these examples. Depending on the need, one skilled in the art may determine these optional components and the amounts of their additions according to the specifications required for the semiconductor device and/or the sealing material.

It is desirable for this mode that a preferable epoxy base resin be selected based on the type of a side-chain functional group of the phosphonic acid in order to form a strong bond between the phosphonic acid and the epoxy base resin through an optimum combination between the side-chain functional group of the phosphonic acid and the epoxide group for higher reactivity.

Specifically, in a case in which the phosphonic acid layer 9 containing the carboxyl group is formed on the sealed member, both the alicyclic epoxy resin and the aliphatic epoxy resin are suitable as the epoxy base resin for the resin layer 8. Alternatively, the epoxy base resin may be a mixture of the alicyclic epoxy resin and the aliphatic epoxy resin. It is more desirable that the alicyclic epoxy resin be used as the epoxy base resin.

In a case in which the phosphonic acid layer 9 containing the amino group is formed on the sealed member, it is desirable that the aliphatic epoxy resin be used as the epoxy base resin for the resin layer 8. This is because the reactivity of the alicyclic epoxy resin with the amine functional group is generally lower than the reactivity of the aliphatic epoxy resin with the amine functional group. Nevertheless, as long as the aliphatic epoxy resin is mixed as the main component of the epoxy base resin, the alicyclic epoxy resin may be added thereto.

In a case in which the phosphonic acid layer 9 containing both the carboxyl group and the amino group is formed on the sealed member, it is desirable that the epoxy base resin to form the resin layer 8 be the aliphatic epoxy resin, or a mixture of the aliphatic epoxy resin and the alicyclic epoxy resin.

It should be noted that regardless of the type of the phosphonic acid to form the phosphonic acid layer 9, there are cases in which it does not matter that an epoxy base resin other than the above-discussed preferred epoxy base resins, and a small amount of other thermosetting base resins, are added thereto.

The resin layer may be formed by laminating two or more layers of resin compositions which are different in composition from each other, although this is not illustrated in the drawing. In this case, a first resin layer of an epoxy resin composition containing the above-mentioned specific epoxy base resin is formed at least in a place in contact with the phosphonic acid layer. It is desirable that the first resin layer be at least 10 μm in thickness. In addition, a second resin layer, provided in contact with the first resin layer but out of contact with the phosphonic acid layer, may have a freely chosen composition. It is particularly desirable that the second resin layer have a high glass transition temperature (Tg) and be resistant to high temperature. For example, it is desirable that the second resin layer be made of a resin composition containing at least the alicyclic epoxy resin as the thermosetting base resin, and optionally containing, the bisphenol A epoxy resin as well. Furthermore, it is desirable that the resin composition contain the acid anhydride curing agent as the curing agent, and further contain the inorganic fillers. Moreover, it is desirable that the glass transition temperature (Tg) of the second resin layer having the above-discussed composition be higher than the junction temperature (Tj) of the semiconductor element by 10° C. or more, and it is more desirable that the glass transition temperature (Tg) be equal to or higher than 200° C.

A manufacturing method of the semiconductor device of the embodiment includes steps of: mounting the semiconductor element 1 on the laminated substrate 2; forming the phosphonic acid layer 9 on the member containing the laminated substrate 2 and the semiconductor element 1; and bringing the resin composition containing the epoxy base resin and the curing agent into contact with the phosphonic acid layer 9. The step of mounting the semiconductor element 1 on the laminated substrate 2 can be performed by bonding the semiconductor element 1, the implant pins 6, the printed circuit board 7, necessary connecting terminals, and the like to the laminated substrate 2 using the solder 1 according to the usual method.

The step of forming the phosphonic acid layer 9 on the thus-bonded sealed member can be performed by making a phosphonic acid solution attach to the surface of the sealed member using a freely chosen method. The following descriptions will be provided for an example of a specific method of forming the phosphonic acid layer 9. To begin with, the phosphonic acid is dissolved in an organic solvent to prepare the phosphonic acid solution. Examples of the organic solvent include toluene, 2-propanol and tetrahydrofuran (THF). Nevertheless, the organic solvent is not limited to those listed. The preparation of the phosphonic acid solution may be achieved by using one type of phosphonic acid, or by using two or more types of phosphonic acids. No specific restriction is imposed on the concentration of the phosphonic acid solution. Nevertheless, the concentration thereof may be set within a range of 1 to 10 mM. The sealed member is brought into contact with this solution. Typically, the sealed member can be dipped into the solution. Thereafter, the dipped sealed member is taken out of the solution, followed by cleansing using the organic solvent. After that, the resultant sealed member is dried, for example at a temperature of approximately 100 to 150° C. for approximately 0.5 to 24 hours. Thereby, the phosphonic acid layer 9 can be made to attach to the surface of the sealed member, and preferably, can be covalently bonded to the surface of the sealed member. The step of forming the phosphonic acid layer 9 may be achieved by spraying the phosphonic acid solution onto the surface of the sealed member, or by applying the phosphonic acid solution to the surface of the sealed member using a brush or a dispenser, instead of by the method shown above as an example. The spraying method and the applying method are also included in the step of forming the phosphonic acid layer 9. When the spraying method or the applying method is employed, too, the cleansing using the solvent and the drying can be performed in the same ways as when the method shown above as an example is employed.

The step of bringing the epoxy resin composition containing the epoxy base resin and the curing agent into contact with the formed phosphonic acid layer 9 is performed as follows. To begin with, the epoxy base resin, the curing agent, and optionally added components depending on need may be mixed together to prepare the epoxy resin composition. It is desirable that the epoxy resin composition be degassed under vacuum. Thereafter, the epoxy resin composition is brought into contact with the phosphonic acid layer 9 by potting or transfer molding. After that, the epoxy resin composition can be thermally cured at a curing temperature. The thermal curing may be performed, for example using a two-step curing method in which the epoxy resin composition is heated at a temperature within a range of 80 to 150° C. for a time within a range of approximately 30 minutes to one hour, and thereafter at a temperature within a range of 100 to 200° C. for a time within a range of approximately 1 to 10 hours. Nevertheless, no specific restriction is imposed on the temperature range for thee thermal curing. In a case in which two or more different types of resin compositions are used to form a sealing structure made of two or more layers, the layers may be formed in such a way that one layer is formed after or before another layer is cured.

It should be noted that the semiconductor device of this mode is not limited to the structure illustrated in the drawing. For example, the semiconductor device of this mode may include a case serving as an outer frame to be used when the sealing material is filled into the semiconductor device, or may have a heat-radiation structure on the conductive plate 23 in the laminated substrate 2 with a bonding material interposed in between. Furthermore, the semiconductor device may have no printed circuit board inside, wherein implant pins function as external connecting terminals to be connected to a printed circuit board outside the semiconductor device.

Alternatively, the semiconductor device may have a structure in which metal wires or a lead frame connects the semiconductor element to the conductive plate, external terminals, and connecting terminals inclusive of relay terminals. Specifically, the structure may be such that the semiconductor element is mounted on the laminated substrate, and wires or a lead frame made of Al, Cu and the like electrically connect the semiconductor element to the connecting terminals bonded to the laminated substrate. A heat spreader may be joined to the conductive plate which is the opposite side of the laminated substrate from the semiconductor element. A case having the built-in external terminals may be bonded to the top of the heat spreader. In the semiconductor device like this, too, the phosphonic acid layer can be formed also on the metal wires and the lead frame in addition to the semiconductor element and the laminated substrate in the same way as discussed above. Thereafter, the epoxy resin composition including the above-discussed specific epoxy base resin can be brought into contact with the phosphonic acid layer; and thus, the semiconductor element and the laminated substrate can be sealed with the epoxy resin composition and the phosphonic acid layer. Thereby, the adhesion between the metal and the epoxy resin can be increased.

In the semiconductor device of this mode, the phosphonic acid layer in contact with the sealed member, and the resin layer in contact with the phosphonic acid layer form the sealing material. Although not intended to be restricted by the theory, strong covalent bonding may be formed by the reaction of phosphonyl groups of the phosphonic acid with OH-groups and O$^-$-groups present on the metal surface of the sealed member, and/or with OH-groups and O$^-$-groups present on the ceramic surface of the metal oxide and the like; and the reaction of side-chain carboxyl groups and/or amino groups of the phosphonic acid with the epoxy resin. For this reason, this mode can increase the adhesion between the metal and the epoxy resin.

Conventionally, a method of increasing adhesion between resin and metal by use of a silane coupling agent has been discussed. However, the silane coupling agent has difficulty in exerting the effect of increase in the adhesion, because the silane coupling agent is easily activated in a way to be easily hydrolyzed by moisture. In contrast, the present invention enables the effect of increase in the adhesion by use of the phosphonic acid which is more stable than the silane coupling agent. In addition, since the density of a film made of the phosphonic acid is higher than the density of a film made of the silane coupling agent, the number of reaction points where the film made of the phosphonic acid film reacts with the epoxy resin is greater than the number of points where the film made of the silane coupling agent reacts with the epoxy resin. Accordingly, the present invention can increase the adhesion. The reason for the higher density of the film made of the phosphonic acid, one may consider, is that the phosphonic acid can regenerate OH by supplying $H^+$ to the substrate to continuously react with the substrate, whereas the silane coupling agent can react only with the OH present on a surface to which the film made of the silane coupling agent is bonded. Meanwhile, the increase in the adhesion cannot be expected from the technique disclosed in Patent Document 1 using a nitriltris(methylene)phosphonic acid salt which is a solid in normal temperature. This is because the organic filler of the phosphonic acid salt is a solid, has no reactive side-chain functional group, and is mixed into the epoxy resin, thus resulting in difficulty in forming the reactivity of the phosphonic acid, such as covalent bonding between the base material and the phosphonic acid, as well as covalent bonding between the phosphonic acid and the epoxy resin. In addition, another disadvantage of the technique disclosed in Patent Document 1 is insufficient long-term reliability which comes from the reaction of cations of the phosphonic acid with the epoxy resin.

Second Mode

Figure 2:
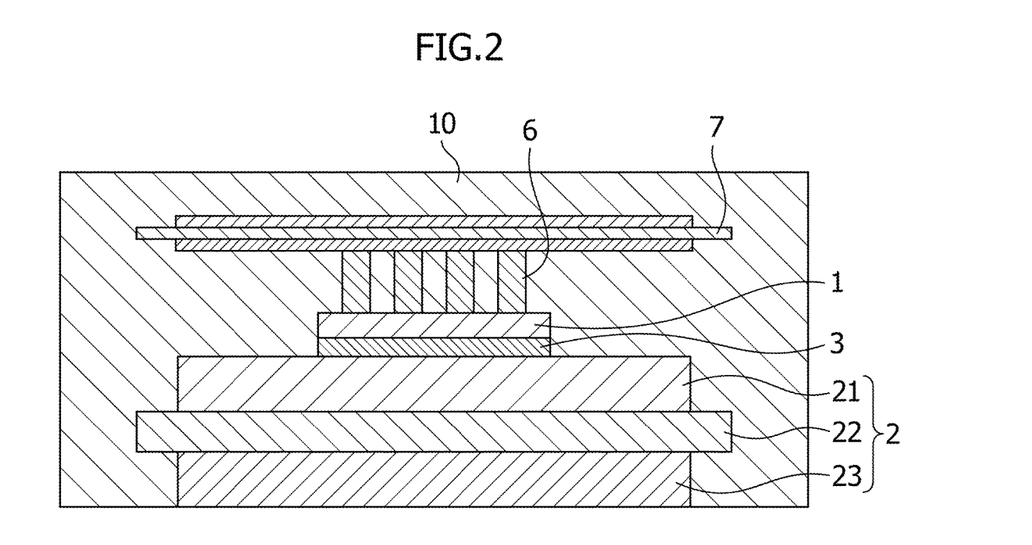
FIG. 2 is a conceptual diagram illustrating a cross-sectional structure of a power module of a second mode of the semiconductor device according to the present invention.

FIG. 2 is a conceptual cross-sectional diagram of a power module which is an example of a semiconductor device of the second mode of the present invention. In FIG. 2, the configurations and materials of the laminated substrate 2, the semiconductor element 1, the implant pins 6 and the printed circuit board 7 may be the same as those of the mode illustrated in FIG. 1. Although no phosphonic acid layer is present in the power module illustrated in FIG. 2, the sealing material 10 contains the thermosetting base resin, the curing agent, and the phosphonic acid. It is desirable that the phosphonic acid be substantially uniformly mixed in the sealing material 10.

This mode may employ types of the phosphonic acid, and preferable combinations of the phosphonic acid and the epoxy base resin which are the same as those discussed for the first mode. In this respect, descriptions thereof will be omitted. Furthermore, the curing agent which is one component of the sealing material 10, as well as the inorganic filler and other optional components which may be contained in the sealing material 10 may be the same as those described for the first mode. In the second mode, too, the phosphonic acid may include compound species in which hydroxyl group(s) is removed by a dehydration reaction or the like to be bonded to a whole or part of the surface of the sealed member, or a whole or part of the surface of optional the inorganic filler. Moreover, the phosphonic acid may include compound species which have remained as it is since mixed into the sealing material.

It is desirable that the sealing material 10 of the second mode contain 0.01 to 1 parts by mass of the phosphonic acid relative to 100 parts by mass of the epoxy base resin. It is more desirable that the sealing material 10 of the second mode contain 0.05 to 0.2 parts by mass of the phosphonic acid relative to 100 parts by mass of the epoxy base resin. When the proportion of the phosphonic acid to the epoxy base resin in the sealing material 10 is less than the above range, there is likelihood that the effect of the adhesion will be insufficient. When the proportion is greater than the above range, there is likelihood that the glass transition temperature of the sealing material will be lower.

The sealing material may be formed by laminating two or more layers of resin compositions which are different in composition from each other, although not illustrated. In that case, a first sealing material layer is arranged at least at a place in contact with the sealed member, and contains the phosphonic acid. In this case, it is desirable that the first sealing material layer be at least 10 µm in thickness. A second sealing material layer arranged in a different place may have a freely selected composition. The second sealing material does not have to contain the phosphonic acid. However, it is particularly desirable that the second sealing material be high in glass transition temperature (Tg) and be resistant to high temperature. For example, the composition of the second sealing material may be the same as that of the second resin layer described in the first mode.

A manufacturing method of the semiconductor device of the second mode includes steps of: mounting the semiconductor element on the laminated substrate; and sealing the sealed member which may include the laminated substrate and the semiconductor element, with the sealing material containing the epoxy base resin, the curing agent and the phosphonic acid. The step of mounting the semiconductor element on the laminated substrate may be performed like in the first mode. The sealing step may be performed in the same manner as in a usual semiconductor sealing method, except that the phosphonic acid is mixed into the sealing material.

The semiconductor device and its manufacturing method of the second mode have the same advantages as those of the first mode. Specifically, although not intended to be restricted by the theory, strong covalent bonding is formed by: the reaction of the phosphonyl groups of the phosphonic acid, mixed in the sealing material, with OH-groups and $O^-$-groups present on the metal surface of the sealed member in contact with the phosphonic acid, and/or with OH-groups and $O^-$-groups present on the ceramic surface of the metal oxide and the like in contact with the phosphonic acid; and the reaction of side-chain carboxyl groups and/or amino groups of the phosphonic acid with the epoxy resin. For this reason, this mode can increase the adhesion between the metal and the epoxy resin. In a case in which the sealing material contains inorganic fillers, the phosphonic acid substantially uniformly present in the epoxy resin simultaneously has an effect of increase in the adhesion between the inorganic fillers and the epoxy resin. In addition to this, since the sealed member is sealed with the sealing material after the phosphonic acid is mixed into the epoxy resin, a step of forming the phosphonic acid layer can be eliminated.

Furthermore, as a modified mode, the semiconductor device may be one which has both the characteristic of the first mode and the characteristics of the second mode. Specifically, the phosphonic acid layer may be formed on the surface of the sealed member; the resin layer also contains the phosphonic acid which is substantially uniformly mixed in the resin layer; and the phosphonic acid layer and the resin layer form the sealing material in the modified mode.

Third Mode

Figure 3:
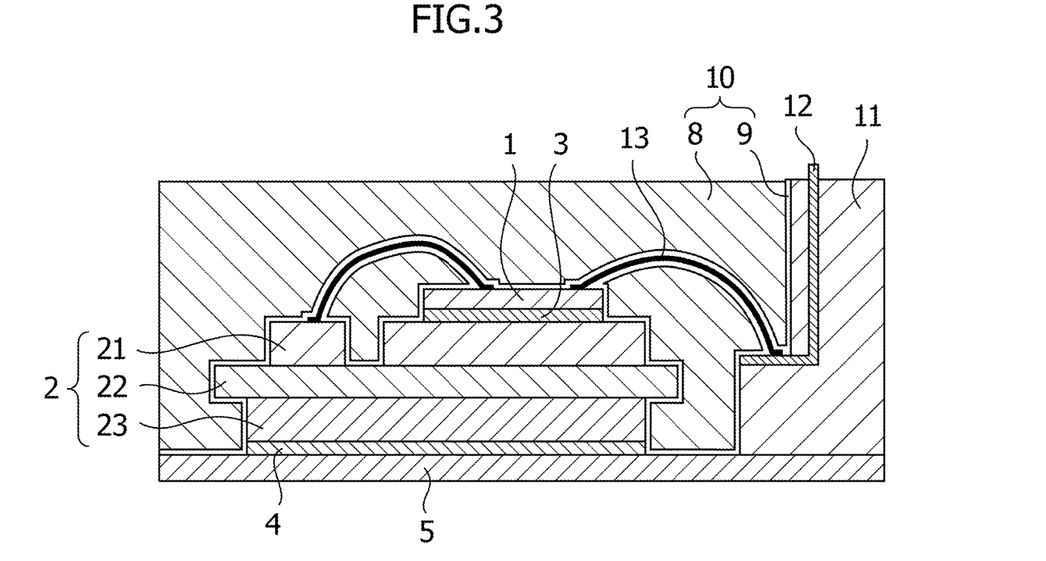
FIG. 3 is a conceptual diagram illustrating a cross-sectional structure of a power module of a third mode of the semiconductor device according to the present invention.

FIG. 3 is a conceptual cross-sectional diagram of a power module which is an example of a semiconductor device of the third mode of the present invention. In FIG. 3, the semiconductor element 1 is mounted on the laminated substrate 2 with the bonding layer 3 of solder or the like interposed in between. The laminated substrate 2 is mounted on a base 5 with a bonding layer 4 of solder or the like interposed in between. A case 11 is provided with an external terminal 12, and is mounted on the base 5 using an adhesive or the like. The upper surface of the semiconductor element 1 is connected via a wire 13 to the external terminal 12 which is attached to the upper surface of another semiconductor element and the top of the laminated substrate 2, as well as provided to the case 11. The phosphonic acid layer 9 is formed on the upper surfaces of the laminated substrate 2, the semiconductor element 1 and the case 11. The resin layer 8 is formed in contact with the phosphonic acid layer 9. The phosphonic acid layer 9 and the resin layer 8 form the sealing material 10.

It should be noted that in the specification, the "upper surface" and the "lower surface" are terms used to indicate the upper and lower directions, relatively, in the drawings for explanatory purposes. These terms are not intended to denote which side of the semiconductor module is the "upper" and which is the "lower" when it is in use. Furthermore, what is referred to as a sealed member in the present application is a member which includes the semiconductor element 1, the laminated substrate 2 and the case 11, and which is insulated by and sealed with the sealing material in a usual sealing mode. In the illustrated embodiment, the sealed member includes the semiconductor element 1, the laminated substrate 2, the bonding layers 3, 4, the base 5, the wire 13 and the case 11.

The configurations of the semiconductor element 1, the laminated substrate 2 and the bonding layers 3, 4 may be the same as those of the first mode. For this reason, descriptions thereof will be omitted. No specific restriction is imposed on the base 5, as long as the base 5 is what is generally used in semiconductor devices. However, it is desirable, for example, that a Cu plate, an Al—SiC plate or the like be used as the base 5, because the materials of these plates are high in thermal conductivity and are less likely to be warped by a high-temperature heating process such as soldering. Furthermore, the base 5 may have a heat radiation structure such as cooling fins. In that case, a material such as Al can be used for the base 5.

No specific restriction is imposed on the wire 13, as long as the wire 15 is what is generally used in semiconductor devices. For example, an Al wire, an Al-plated steel wire, a Cu wire or the like may be used as the wire 13. Furthermore, no specific restriction is imposed of the diameter of the wire 13. For example, it is desirable that a wire with a diameter of 300 μm to 500 μm be used for a large current application. Alternatively, the lead frame discussed in the first mode may be used instead of the wire 13, or a circuit board and conductive pins are electrically connected to form a circuit instead of the wire 13. Thus, this mode is not limited by the configuration of the sealed member illustrated in FIG. 3, and is applicable to a freely selected configuration of a semiconductor element having a case. The external terminal 12 is a member which is capable of electrically connecting the electric circuit inside the semiconductor device and a device outside the semiconductor device. A Cu member, a Ni-plated Cu member, a Cu-plated member or the like may be used as the external terminal 12. The external terminal 12 is not limited to these examples.

The case 11 is a member which serves as an external frame when the sealing material is put in. The case 11 may be a resin case made of a resin which has good heat resistance and chemical resistance. Examples of the resin contained in the resin case include a polyphenylene sulfide resin (PPS resin), a polyvinylene terephthalate resin (PBT), a polyacetal resin (POM). Nevertheless, the resin contained in the resin case is not limited to these examples.

Preferably, a case containing a PPS resin, or a case made of a PPS may be used as the case 11. It is desirable that the case 11 be surface-treated. In that case, it is desirable that the surface treatment be applied to at least a surface of the case 11 in contact with the phosphonic acid layer 9 included in the sealing material. The purpose of the surface treatment is to further enhance the effect of the phosphonic acid to increase the adhesion. The surface treatment method may be a hydrophilic treatment such as a UV ozone treatment, an atmospheric pressure plasma treatment, or a reduced-pressure plasma treatment. The UV ozone treatment may be a UV (ultraviolet) treatment or an ozone treatment. When the resin case is irradiated with UV rays, the surface of the resin case can be made hydrophilic because the UV rays cleave the bonds of molecules constituting the resin and thereby form the surface of the resin case into an active surface. Meanwhile, when the resin case is irradiated with UV rays in an atmospheric environment or the like containing oxygen, ozone is generated, and the oxidizing effect of the ozone makes the resin surface hydrophilic. Alternatively, ozone alone may be induced to be used for surface treatment of the resin. In particular, it is preferable that the surface treatment include treatment with ozone. In particular, a low pressure mercury lamp having primary wavelengths of 254 nm and 185 nm may be used. Nevertheless, the surface treatment is not limited to this example. The surface treatment makes it possible to make the resin surface, particularly the surface of the PPS resin, hydrophilic. Functional groups such as COOH, OH, and/or $SO_3H$ are present on the surface-treated surface of the resin, particularly on the treated surface of the PPS resin. Accordingly, the phosphonic acid becomes easy to bond to the resin.

In the third mode, the phosphonic acid layer 9 is formed on the surface of the case 11, and the phosphonic acid layer 9 and the resin layer 8 together form the sealing material 10 like in the first mode. Furthermore, the phosphonic acid layer 9 may be formed selectively on the surface of the sealed member including the semiconductor element 1, the laminated substrate 2, the base 5, the wire 13, other members (not illustrated), and the like. FIG. 3 illustrates a mode in which the phosphonic acid layer 9 is formed on the entirety of the sealed members. Nevertheless, the third mode is not limited to this mode. In the third mode, the phosphonic acid layer 9 is formed at least on the surface of the case 11. A "state in which the phosphonic acid layer is formed" and a method of detecting the state are the same as described in the first mode.

In this mode, too, the type of the phosphonic acid which may be contained in the phosphonic acid layer 9, and a preferable combination of the epoxy base resin and the phosphonic acid which may be contained in the epoxy resin composition constituting the resin layer 8 may be the same as described in the first mode. For this reason, descriptions thereof will be omitted. In addition, the curing agent contained in the epoxy resin composition forming the resin layer 8, as well as the inorganic filler and other components which may be optionally contained may be appropriately selected from the same options as discussed in the first mode. In the third mode, too, the phosphonic acid may include compound species in which hydroxyl group(s) is removed by a dehydration reaction or the like to be bonded to a whole or part of the surface of the sealed member, or a whole or part of the surface of optional the inorganic filler. Moreover, the phosphonic acid may include compound species which have remained as it is since mixed into the sealing material.

In addition, the resin layer 8 may be formed by laminating two or more layers of resin compositions which are different in composition from each other, although not illustrated. In that case, the preferable compositions, thicknesses and placement positions of the first and second resin layers may be the same as those discussed in the first mode.

A manufacturing method of the semiconductor device of this mode includes the steps of: mounting the semiconductor element 1 on the laminated substrate 2; assembling the case 11 with the laminated substrate 2 on which the semiconductor element 1 is mounted; forming the phosphonic acid layer 9 at least on the surface of the case 11; and bringing the epoxy resin composition containing the epoxy base resin and the curing agent into contact with the phosphonic acid layer 9. The step of mounting the semiconductor element 1 on the laminated substrate 2 can be performed by bonding the semiconductor element 1 to the laminated substrate 2 using the solder 3 according to a usual method. In detail, the step of assembling the case 11 with the laminated substrate 2 on which the semiconductor element 1 is mounted can be performed using a process of bonding the laminated substrate 2 to the base 5 using the bonding layer 4 of solder or the like, and bonding the case 11 to the base 5 to which the laminated substrate 2 is bonded using an adhesive. Nevertheless, the step of assembling the case 11 is not limited to the specific method. Optionally, at least a step of surface-treating the case 11 can be performed before or after the step of assembling the case. The surface treatment may be a hydrophilization treatment such as the UV ozone treatment, the atmospheric pressure plasma treatment, or the reduced-pressure plasma treatment which have been mentioned above. The surface treatment can be applied to a surface of the case 11 on which the phosphonic acid layer 9 is formed. In a case in which the surface treatment is performed after the step of assembling the case, the surface treatment may be applied not only to the case 11, but also at least to a surface in contact with the sealing material out of the whole of the sealed member including the laminated substrate 2, the semiconductor element 1 and the case 11.

The step of forming the phosphonic acid layer 9 on at least the surface of the case 11 can be performed by attaching the phosphonic acid solution to the surface of the case 11 by a freely selected method. A specific example of the method of forming the phosphonic acid layer 9 may be the same as that described in the first mode. In this step, the phosphonic acid layer 9 may be formed optionally on the surface of the sealed member other than the case 11.

The step of bringing the formed phosphonic acid layer 9 into contact with the epoxy resin composition containing the epoxy base resin and the curing agent can be performed in the same way as discussed in the first mode. In the third mode, too, in a case in which two or more different types of resin compositions can be used to form a sealing structure of two or more layers, the layers may be formed after or before each layer is cured.

In the semiconductor device of this mode, the sealing material is made of at least the phosphonic acid layer in contact with the case, and the resin layer in contact with the phosphonic acid layer. Although not intended to be restricted by the theory, strong covalent bonding is formed by the reaction of the phosphonyl groups of the phosphonic acid with OH-groups and O⁻-groups present on the resin surface of the case of the sealed member, and the reaction of side-chain carboxyl groups and/or amino groups of the phosphonic acid with the epoxy resin. Accordingly, this mode can enhance the adhesion between the case resin and the epoxy resin. Furthermore, in the case in which the phosphonic acid layer 9 is also formed optionally on the surface of the sealed member other than the case, strong covalent bonding may be formed by the reaction of the phosphonyl groups of the phosphonic acid not only with OH-groups and O⁻-groups present on the resin surface of the case, but also with OH-groups and O⁻-groups present on the metal surface of the rest of the sealed member and/or on the ceramic surface of the metal oxide; and by the reaction of side-chain carboxyl groups and/or amino groups of the phosphonic acid with the epoxy resin. Thereby, the adhesion between the metal and the epoxy resin can be enhanced. Conventionally, the method of enhancing the adhesion between the resin case and the sealing resin using the silane coupling agent has been studied, because the interface between the resin case and the sealing resin is more likely to be peeled by thermal stress. However, the disadvantage of the use of the silane coupling agent is as discussed in the first mode. This mode can particularly enhance the adhesion between the resin case and the sealing resin, as well as accordingly makes it possible to obtain a highly-reliable semiconductor device.

Fourth Mode

Figure 4:
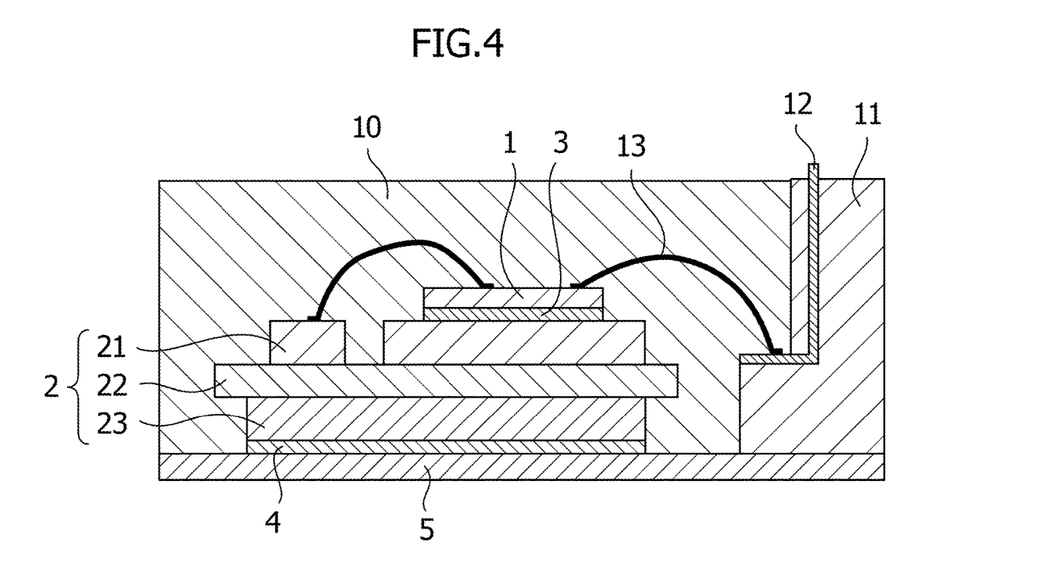
FIG. 4 is a conceptual diagram illustrating a cross-sectional structure of a power module of a fourth mode of the semiconductor device according to the present invention.

FIG. 4 is a conceptual cross-sectional diagram of a power module which is an example of a semiconductor device of the fourth mode of the present invention. In FIG. 4, too, the configurations and materials of the laminated substrate 2, the semiconductor element 1 and the surface-treated case 11 may be the same as those of the mode illustrated in FIG. 3. Although no phosphonic acid layer is present in the power module illustrated in FIG. 4, the sealing material 10 contains the thermosetting base resin, the curing agent, and the phosphonic acid. It is desirable that the phosphonic acid be substantially uniformly mixed in the sealing material 10.

In the fourth mode, the composition and placement mode of the sealing material 10 may be the same as those of the sealing material 10 of the second mode. Specifically, the type of the phosphonic acid, the content of the phosphonic acid in the sealing material 10, as well as the preferable combination of the phosphonic acid and the epoxy base resin may be the same as those discussed in the first to third modes. For this reason, descriptions thereof will be omitted. In addition, the curing agent, which is one component of the sealing material 10, as well as the inorganic filler and other components which may be optionally contained, may also be the same as those described in the first to third embodiments. Incidentally, in the fourth embodiment, too, the phosphonic acid may include compound species in which hydroxyl group(s) is removed by a dehydration reaction or the like to be bonded to a whole or part of the surface of the sealed member, or a whole or part of the surface of optional the inorganic filler. Moreover, the phosphonic acid may include compound species which have remained as it is since mixed into the sealing material.

In addition, the sealing material may be formed by laminating two or more layers of resin compositions which are different in composition from each other, although not illustrated. In that case, the preferable compositions, thicknesses and placement positions of the first and second sealing material layers may be the same as those discussed in the second mode.

A manufacturing method of the semiconductor device of the fourth mode includes the steps of: mounting the semiconductor element 1 on the laminated substrate 2; assembling the case 11 with the laminated substrate 2 on which the semiconductor element 1 is mounted; and sealing the sealed member, inclusive of the laminated substrate 2, the semiconductor element 1 and the case 11, with the sealing material 10 containing the epoxy base resin, the curing agent and the phosphonic acid. The step of mounting the semiconductor element 1 on the laminated substrate 2, and the step of assembling the case 11 with the laminated substrate 2 on which the semiconductor element 1 is mounted can be performed in the same way as those are performed in the third mode. Furthermore, the sealing step can be performed in the same way as that is performed in the second mode. To put it specifically, the sealing step can be performed in the same way as the usual semiconductor sealing method is performed, except that phosphonic acid is mixed with the sealing material.

The semiconductor device and its manufacturing method of the fourth mode have the same advantages as do those of the third mode. Specifically, in this mode, too, although not intended to be restricted by the theory, strong covalent bonding is formed by the reaction of the phosphonyl groups of the phosphonic acid, mixed in the sealing material, with OH-groups and O$^-$-groups present on the case resin surface and the metal surface of the sealed member in contact with the phosphonic acid, and/or with OH-groups and O$^-$-groups present on the ceramic surface of the metal oxide and the like; and the reaction of side-chain carboxyl groups and/or amino groups of the phosphonic acid with the epoxy resin. Accordingly, this mode can enhance the adhesion between the metal and the epoxy resin. Furthermore, in a case in which the sealing material contains the inorganic filler, the phosphonic acid substantially uniformly existing in the epoxy resin concurrently has the effect of the increase in the adhesion between the inorganic filler and the epoxy resin.

In addition to this, since the sealed member is sealed with the sealing material after the phosphonic acid is mixed into the epoxy resin, a step of forming the phosphonic acid layer can be eliminated.

Furthermore, as a modified mode, the semiconductor device may have both the characteristic of the third mode and the characteristic of the fourth mode. Specifically, the phosphonic acid layer is formed on the surface of the sealed member including the case; the resin layer also contains the phosphonic acid which is substantially uniformly mixed in the resin layer; and the phosphonic acid layer and the resin layer form the sealing material in the modified mode.

Second Embodiment: Resin Composition

A second embodiment of the present invention is a sealing resin composition. The sealing resin composition includes an epoxy base resin, a curing agent and a phosphonic acid. Optionally, the sealing resin composition further includes an inorganic filler, a curing accelerator, and additives such as a flame retardant and a coloring agent. The sealing resin composition of this embodiment may have the same feature as do the sealing resin compositions of the second to fourth modes of the first embodiment. For this reason, descriptions for the sealing resin composition of this embodiment will be omitted.

The sealing resin composition of this embodiment is preferably used as a sealing material for insulation-sealing in electronic devices. Such electronic devices will be described later.

Third Embodiment: Electronic Devices

A third embodiment of the present invention relates to an electronic device sealed with the resin composition of the second embodiment. Typically, the electronic device may be the semiconductor device of the first embodiment.

Other examples of the electronic device include electric and electric-power appliances such as automobiles, vehicles, aircrafts, ships, vending machines, air conditioners, power generators. Specific examples of the electronic device include a semiconductor module, a mold transformer, a gas-insulated switchgear. Nevertheless, the electronic device is not limited to these specific examples.

Since the electronic device of the embodiment uses a sealing material having excellent adhesion to metals, even if used outdoor in a hard-to-control environment, the electronic device of the embodiment is highly reliable.

EXAMPLES

The present invention will be hereinbelow described in more detail by citing examples of the present invention. However, the present invention is not limited to the scope of the following examples.

Example 1-1

For a heat cycle evaluation, a power semiconductor device for 3.3 kV was produced. As a laminated substrate, a DENKA SIN plate (made by Denki Kagaku Kogyo Co., Ltd., of which the frame length was 1.0 mm) having a conductive plate with a thickness of 0.3 mm, and an insulating substrate with a thickness of 0.625 mm was used. A sealed member was obtained by assembling solder and a power semiconductor element, solder and copper pins, and a printed circuit board with the laminated substrate by soldering them in an $N_2$ reflow oven. Subsequently, an aminomethyl phosphonic acid (Tokyo Chemical Industry Co., Ltd.) was dissolved in 2-propanol to prepare a phosphonic acid solution of 5 mM. The sealed member including the laminated substrate, as well as the semiconductor element, the solder, the copper pins and the printed circuit board which were mounted thereon was immersed in the phosphonic acid solution for 12 hours. After that, the sealed member was washed with 2-propanol and dried at 100° C. for 1 hour. The sealed member, subjected to the phosphonic acid treatment, was set in a mold.

A sealing material was obtained by mixing an aliphatic epoxy base resin: jER 630 (made by Mitsubishi Chemical Corporation), a curing agent: jER cure 113 (made by Mitsubishi Chemical Corporation), and an inorganic filler: EXCELICA with an average particle size of several μm to several tens μm (Tokuyama Corporation) together in a mass ratio of 10:5:3, followed by vacuum degassing. The sealing material was injected into the mold. Primary curing was performed at 100° C. for 1 hour, and thereafter secondary curing was performed at 150° C. for 3 hours. Thereby, the power semiconductor device was obtained.

Example 1-2

A step of mounting a semiconductor element, solder, copper pins and a printed circuit board on a laminated substrate was performed in the same way as was that of Example 1-1, using the same members as those of Example 1-1. A sealed member obtained through the step was set in a mold.

A sealing material was obtained by mixing the aliphatic epoxy base resin: jER 630 (made by Mitsubishi Chemical Corporation), the curing agent: jER cure 113 (made by Mitsubishi Chemical Corporation), the inorganic filler: EXCELICA with an average particle size of several μm to several tens μm (Tokuyama Corporation), and an aminomethyl phosphonic acid (Tokyo Chemical Industry Co., Ltd.) together in a mass ratio of 10:5:3:0.01, followed by vacuum degassing. The sealing material was injected into the mold. Primary curing was performed at 100° C. for 1 hour, and thereafter, secondary curing was performed at 150° C. for 3 hours. Thereby, a power semiconductor device was obtained.

Example 1-3

A power semiconductor device was obtained in the same way as was the power semiconductor device of Example 1-1, except that (3-carboxypropyl)phosphonic acid (Tokyo Chemical Industry Co., Ltd.) was used as the phosphonic acid.

Example 1-4

A power semiconductor device was obtained in the same way as was the power semiconductor device of Example 1-2, except that (3-carboxypropyl)phosphonic acid (Tokyo Chemical Industry Co., Ltd.) was used as the phosphonic acid.

Example 1-5

A power semiconductor device was obtained in the same way as was the power semiconductor device of Example 1-1, except that the (3-carboxypropyl)phosphonic acid (Tokyo Chemical Industry Co., Ltd.) was used as the phosphonic acid; an alicyclic epoxy: CELLOXIDE 2021P (Daicel Corporation) was used as the epoxy base resin; and RIKACID MH-700 (New Japan Chemical Co., Ltd.) was as the curing agent.

Example 1-6

A power semiconductor device was obtained in the same way as was the power semiconductor device of Example 1-2, except that the (3-carboxypropyl)phosphonic acid (Tokyo Chemical Industry Co., Ltd.) was used as the phosphonic acid; the alicyclic epoxy: CELLOXIDE 2021P (Daicel Corporation) was used as the epoxy base resin; and RIKACID MH-700 (New Japan Chemical Co., Ltd.) was as the curing agent.

Comparative Example 1-1

A power semiconductor device of Comparative Example 1-1 was obtained in the same way as was the power semiconductor device of Example 1-1, except that no phosphonic acid was used.

Comparative Example 1-2

A power semiconductor device of Comparative Example 1-2 was obtained in the same way as was the power semiconductor device of Example 1-5, except that no phosphonic acid was used.

Evaluation

A heat cycle test was performed on the power semiconductor devices of Examples 1-1 to 1-6 and Comparative Examples 1-1, 1-2. The heat cycle test was conducted under conditions that the temperature was at −40° C. to 150° C., and the maximum number of cycles was at 1000. Partial discharge evaluation was carried out at every 100 cycles. As for the partial discharge evaluation, each power semiconductor device was evaluated such that AC 3.5 kV was applied to the power semiconductor device for 1 minute, and 2.6 kV for 30 seconds; and thereafter, in a case in which an amount of charges discharged from the power semiconductor device was 10 pC or less, partial discharge was determined as not being observed from the power semiconductor device. For each power semiconductor device, the result of the heat cycle test is shown in Table 1. In the table, "Good" in the heat cycle test result means that partial discharge was not observed even after 1,000 cycles, while "Poor" in the heat cycle test result means that partial discharge was observed before 1000 cycles was reached.

TABLE 1

|  | Example 1-1 | Example 1-2 | Example 1-3 | Example 1-4 |
|---|---|---|---|---|
| Epoxy Resin | aliphatic epoxy | aliphatic epoxy | aliphatic epoxy | aliphatic epoxy |
| Phosphonic Acid | aminomethyl-phosphonic acid | aminomethyl-phosphonic acid | 3-carboxypropyl-phosphonic acid | 3-carboxypropyl-phosphonic acid |
| How to Apply Phosphonic Acid | immersed | mixed into epoxy | immersed | mixed into epoxy |
| Result of Heat Cycle Test | good | good | good | good |

|  | Example 1-5 | Example 1-6 | Comparative Example 1-1 | Comparative Example 1-2 |
|---|---|---|---|---|
| Epoxy Resin | alicyclic epoxy | alicyclic epoxy | aliphatic epoxy | alicyclic epoxy |
| Phosphonic Acid | 3-carboxypropyl-phosphonic acid | 3-carboxypropyl-phosphonic acid | not contained | not contained |
| How to Apply Phosphonic Acid | immersed | mixed into epoxy | not contained | not contained |
| Result of Heat Cycle Test | good | good | poor | poor |

The heat cycling caused neither peelings nor partial discharge in any of Examples 1-1 to 1-6 using the phosphonic acid. Although not intended to be restricted by the theory, one may consider that the results of the examples reflected an increase in the adhesion between the metal and the epoxy resin. To put it more specifically, one may assume that the increase in the adhesion resulted from the formation of a network among the metal, the phosphonic acid and the epoxy resin due to the covalent bonding between phosphonyl groups of the phosphonic acid and OH groups or $O^-$-groups on the surface of the metal or metal oxide; and the bonding between side-chain functional groups of the phosphonic acid and either aromatic rings of the aliphatic epoxy resin or alicyclic groups of the alicyclic epoxy resin. No effect of the increase in the adhesion was obtained from the comparative examples. Partial discharge occurred at 400 cycles in Comparative Example 1-1, and at 500 cycles in Comparative Example 1-2.

One may consider that in these comparative examples, the heat cycle caused peeling between the metal and the resin, thus resulting in the partial discharge.

Furthermore, experiments were performed in the same way as those in Examples 1-1, 1-2, 1-5 and 1-6, except that the phosphonic acid was replaced with 2-amino-6-phosphonohexanoic acid. Their heat cycle test results were evaluated as good. Moreover, in each of Examples 1-3 and 1-4, an experiment was also performed in which the epoxy base resin was replaced with a mixture of the aliphatic epoxy base resin: jER 630 and the alicyclic epoxy: CELLOXIDE 2021P (Daicel Corporation) in a mass ratio of 1:2; and the RIKACID MH-700 was used as the curing agent. As a result, the heat cycle test result was "good", and a significant increase in the glass transition temperature was observed as compared with the case in which only the aliphatic epoxy base resin was used.

It was found that the use of the examples of the present invention increases the adhesion between the epoxy resin and the metal used in the semiconductor device, and thus enhances the resistance to the heat cycling. The use of the examples of the present invention makes it possible to provide a highly-reliable power semiconductor device.

Example 2-1

For a heat cycle evaluation, a power semiconductor device for 3.3 kV was produced. As a laminated substrate, a DENKA AlN plate (made by Denki Kagaku Kogyo Co., Ltd., in which the frame length was 1.0 mm) having a conductive plate with a thickness of 0.3 mm, and an insulating substrate with a thickness of 1.0 mm was used. Solder and a power semiconductor element were mounted on the laminated substrate by soldering in a $H_2$ reflow oven. Subsequently, the resultant laminated substrate was mounted by soldering on a Cu base (made by Denki Kagaku Kogyo Co., Ltd.). Thereafter, a PPS resin-made case with an external terminal was mounted on the Cu base on which the laminated substrate was mounted, using an adhesive. After that, wiring was made between chips, between each chip and a Cu foil on the laminated substrate, and between each chip and the corresponding external terminal, using a wire with a diameter of 300 μm. Then, the surface of the case was treated by the UV ozone treatment. The surface treatment was performed using a U-shaped ozone lamp under a treatment condition of a 12 J/cm² integrated amount. Incidentally, the ozone lamp used for the surface treatment was one which had a wavelength of 200 nm or less, and which was configured to generate ozone when there was oxygen in the treatment environment.

Next, the aminomethyl phosphonic acid (Tokyo Chemical Industry Co., Ltd.) was dissolved in the 2-propanol to prepare the phosphonic acid solution of 5 mM. The sealed member including the laminated substrate, the semiconductor element mounted on the laminated substrate, and the surface-treated case was immersed in the phosphonic acid solution for 12 hours. After that, the sealed member was washed with 2-propanol and dried at 100° C. for 1 hour. A sealing material was obtained by mixing the aliphatic epoxy base resin: jER 630 (made by Mitsubishi Chemical Corporation), the curing agent: jER Cure 113 (made by Mitsubishi Chemical Corporation), the inorganic filler: EXCELICA with an average particle size of several μm to several tens μm (Tokuyama Corporation) together in a mass ratio of 10:5:3. Subsequently, the sealing material was applied to the sealed member subjected to the phosphonic acid treatment, followed by vacuum degassing. Primary curing was performed at 100° C. for 1 hour, and thereafter secondary curing was performed at 150° C. for 3 hours. Thereby, a power semiconductor device was obtained.

Example 2-2

A step of mounting a semiconductor element and the like on a laminated substrate was performed in the same way as was that of Example 2-1, using the same members as those of Example 2-1. Thereby, a sealed member was obtained. Meanwhile, a sealing material was obtained by mixing the aliphatic epoxy base resin: jER 630 (made by Mitsubishi Chemical Corporation), the curing agent: jER cure 113 (made by Mitsubishi Chemical Corporation), the inorganic filler: EXCELICA with an average particle size of several μm to several tens μm (Tokuyama Corporation), and the aminomethyl phosphonic acid (Tokyo Chemical Industry Co., Ltd.) together in a mass ratio of 10:5:3:0.01. The sealing material was applied to the sealed member, followed by vacuum degassing. Primary curing was performed at 100° C. for 1 hour, and thereafter secondary curing was performed at 150° C. for 3 hours. Thereby, a power semiconductor device was obtained.

Example 2-3

A power semiconductor device was obtained in the same way as was the power semiconductor device of Example 2-1, except that the (3-carboxypropyl)phosphonic acid (Tokyo Chemical Industry Co., Ltd.) was used as the phosphonic acid.

Example 2-4

A power semiconductor device was obtained in the same way as was the power semiconductor device of Example 2-2, except that the (3-carboxypropyl)phosphonic acid (Tokyo Chemical Industry Co., Ltd.) was used as the phosphonic acid.

Example 2-5

A power semiconductor device was obtained in the same way as was the power semiconductor device of Example 2-1, except that the (3-carboxypropyl)phosphonic acid (Tokyo Chemical Industry Co., Ltd.) was used as the phosphonic acid, the alicyclic epoxy: CELLOXIDE 2021P (Daicel Corporation) was used as the epoxy base resin; and RIKACID MH-700 (New Japan Chemical Co., Ltd.) was used as the curing agent.

Example 2-6

A power semiconductor device was obtained in the same way as was the power semiconductor device of Example 2-2, except that: the (3-carboxypropyl)phosphonic acid (Tokyo Chemical Industry Co., Ltd.) was used as the phosphonic acid; the alicyclic epoxy: CELLOXIDE 2021P (Daicel Corporation) was used as the epoxy base resin; and RIKACID MH-700 (New Japan Chemical Co., Ltd.) was as the curing agent.

Examples 2-7, 2-8

A power semiconductor device of Example 2-7 was obtained in the same way as was the power semiconductor device of Example 2-1, except that the UV ozone treatment was not applied. A power semiconductor device of Example 2-8 was obtained in the same way as was the power semiconductor device of Example 2-2, except that the UV ozone treatment was not applied.

Comparative Example 2-1

A power semiconductor device of Comparative Example 2-1 was obtained in the same way as was the power semiconductor device of Example 2-1, except that no phosphonic acid was used.

Evaluation

A heat cycle test was performed on the power semiconductor devices of Examples 2-1 to 2-8 and Comparative Example 2-1. The heat cycle test was conducted under conditions that the temperature was at −40° C. to 150° C., and the maximum number of cycles was at 1000. Partial discharge evaluation was carried out every 100 cycles. As for the partial discharge evaluation, each power semiconductor device was evaluated such that AC 3.5 kV was applied to the power semiconductor device for 1 minute, and 2.6 kV for 30 seconds; and thereafter, in a case in which an amount of charges discharged from the power semiconductor device was 10 pC or less, partial discharge was determined as not being observed from the power semiconductor device. For each power semiconductor device, the result of the heat cycle test is shown in Table 2. In the table, "Good" in the heat cycle test result means that partial discharge was not observed even after 1,000 cycles, while "Poor" in the heat cycle test result means that partial discharge was observed before 1000 cycles was reached.

TABLE 2

|  | Example 2-1 | Example 2-2 | Example 2-3 | Example 2-4 | Example 2-5 |
|---|---|---|---|---|---|
| Surface Treatment | UV ozone | UV ozone | UV ozone | UV ozone | UV ozone |
| Epoxy Resin | aliphatic epoxy | aliphatic epoxy | aliphatic epoxy | aliphatic epoxy | alicyclic epoxy |
| Phosphonic Acid | aminomethyl-phosphonic acid | aminomethyl-phosphonic acid | 3-carboxypropyl-phosphonic acid | 3-carboxypropyl-phosphonic acid | 3-carboxypropyl-phosphonic acid |
| How to Apply Phosphonic Acid | immersed | mixed into epoxy | Immersed | mixed into epoxy | immersed |
| Result of Heat Cycle Test | good | good | good | good | good |

|  | Example 2-6 | Example 2-7 | Example 2-8 | Comparative Example 2-1 |
|---|---|---|---|---|
| Surface Treatment | UV ozone | not performed | not performed | performed |
| Epoxy Resin | alicyclic epoxy | aliphatic epoxy | aliphatic epoxy | aliphatic epoxy |
| Phosphonic Acid | 3-carboxypropyl-phosphonic acid | aminomethyl-phosphonic acid | aminomethyl-phosphonic acid | not contained |
| How to Apply Phosphonic Acid | mixed into epoxy | immersed | mixed into epoxy | not contained |
| Result of Heat Cycle Test | good | good | good | poor |

The heat cycle caused neither peelings nor partial discharge in any of Examples 2-1 to 2-6 using the phosphonic acid. Although not intended to be restricted by the theory, one may consider that the results of the examples reflected an increase in the adhesion between the case resin and the epoxy resin. To be more specific, one may assume that the increase in the adhesion resulted from the formation of a network among the PPS resin, the phosphonic acid and the epoxy resin due to the covalent bonding between phosphonyl groups of the phosphonic acid and OH groups or O$^-$-groups on the surface of the PPS resin which had been subjected to the UV ozone treatment; and the bonding between side-chain functional groups of the phosphonic acid and either aromatic rings of the aliphatic epoxy resin or alicyclic groups of the alicyclic epoxy resin. The results of the heat cycle tests of Examples 2-7 and 2-8 were good, but slight partial discharge was observed from Examples 2-7 and 2-8. One may assume that the partial discharge in Examples 2-7 and 2-8 was caused by a slightly weak effect of the increase in the adhesion which resulted from no UV ozone treatment being performed on the case surface to make it hard for the phosphonic acid to be formed on the case surface. Meanwhile, partial discharge occurred at 400 cycles in Comparative Example 2-1, since no phosphonic acid existed therein. One may consider that in these comparative examples, the heat cycle caused peeling between the case resin and the sealing material, thus resulting in the partial discharge.

Furthermore, experiments were performed in the same way as those in Examples 2-1, 2-2, 2-5 and 2-6, except that the phosphonic acid was replaced with the 2-amino-6-phosphonohexanoic acid. Their heat cycle test results were evaluated as good. Moreover, in each of Examples 2-3 and 2-4, an experiment was also performed in which the epoxy base resin was replaced with a mixture of the aliphatic epoxy base resin: jER 630 and the alicyclic epoxy: CELLOXIDE 2021P (Daicel Corporation) in a mass ratio of 1:2; and the RIKACID MH-700 was used as the curing agent. As a result, the heat cycle test result remained good, and a significant increase in the glass transition temperature was observed as compared with the case in which only the aliphatic epoxy base resin was used.

It was found that the use of the examples of the present invention increases the adhesion between the epoxy resin and the PPS resin-made case used in the semiconductor device, and thus enhances the resistance to the heat cycling. The use of the examples of the present invention makes it possible to provide a highly-reliable power semiconductor device.

REFERENCE SYMBOLS LIST 1 semiconductor element
2 laminated substrate
21 second conductive plate
22 insulating substrate
23 first conductive plate
3 bonding layer
4 bonding layer
5 base
6 implant pin
7 printed circuit board
8 resin layer
9 phosphonic acid layer
10 sealing material
11 case
12 external terminal
13 wire

The invention claimed is:

1. A semiconductor device comprising:
a laminated substrate on which a semiconductor element is mounted; and
a sealing material, wherein the sealing material contains an epoxy base resin, a curing agent, and a phosphonic acid containing at least one phosphonyl group, —P(=O)(OH)$_2$, and containing a carboxyl group and/or an amino group.

2. The semiconductor device according to claim 1, further comprising:
a resin case.

3. The semiconductor device according to claim 2, wherein the resin case is a surface-treated resin case.

4. The semiconductor device according to claim 2, wherein the resin case contains a polyphenylene sulfide resin.

5. The semiconductor device according to claim 2, wherein a layer of the phosphonic acid is formed on a surface of the resin case such that the phosphonic acid layer is separate from the sealing material.

6. A manufacturing method of a semiconductor device according to claim 5, comprising the steps of:
mounting a semiconductor element on a laminated substrate;
assembling a case with the laminated substrate on which the semiconductor element is mounted;
forming a phosphonic acid layer at least on a surface of the case; and
bringing an epoxy resin composition containing an epoxy base resin and a curing agent into contact with the phosphonic acid layer.

7. The manufacturing method according to claim 6, further comprising the step of:
surface-treating the surface of the case before the step of forming the phosphonic acid layer.

8. The semiconductor device according to claim 1, wherein a layer of the phosphonic acid is formed on a surface of a sealed member including the semiconductor element and the laminated substrate such that the phosphonic acid layer is separate from the sealing material.

9. A manufacturing method of a semiconductor device according to claim 8, comprising the steps of:
mounting a semiconductor element on a laminated substrate;
forming a phosphonic acid layer on a surface of a member including the laminated substrate and the semiconductor element; and
bringing an epoxy resin composition containing an epoxy base resin and a curing agent into contact with the phosphonic acid layer.

10. The semiconductor device according to claim 1, wherein the phosphonic acid is substantially uniformly mixed in the sealing material.

11. A manufacturing method of a semiconductor device according to claim 10, comprising the steps of:
mounting a semiconductor element on a laminated substrate; and
sealing a member including the laminated substrate and the semiconductor element with a sealing material containing an epoxy base resin, a curing agent, and a phosphonic acid.

12. The manufacturing method according to claim 11, further comprising the step of:
assembling a case with the laminated substrate on which the semiconductor element is mounted.

13. The semiconductor device according to claim 1, wherein the phosphonic acid containing a carboxyl group is selected from the group consisting of (3-carboxypropyl) phosphonic acid, (2-carboxyethyl) phosphonic acid, carboxymethyl phosphonic acid, (5-carboxypenthyl) phosphonic acid, 6-phosphonohexan acid, 11-phosphonoundecanoic acid, 16-phosphonohexadecan acid, glycine-N, N-bis(methylenephosphonic acid) and 2-amino-6-phosphonohexan acid.

14. The semiconductor device according to claim 1, wherein the phosphonic acid containing an amino group is selected from the group consisting of (1-aminoethyl) phosphonic acid, (aminomethyl) phosphonic acid, (4-aminobenzyl) phosphonic acid, (3-aminophenyl) phosphonic acid, (4-aminophenyl) phosphonic acid, 4-amino-1-hydroxybutane-1, 1-diphosphonic acid, and 2-amino-6-phosphonohexan acid.

15. The semiconductor device according to claim 1, wherein the phosphonic acid contains a carboxyl group, and the epoxy base resin is an alicyclic epoxy and/or an aliphatic epoxy.

16. The semiconductor device according to claim 1, wherein the phosphonic acid contains an amino group, and the epoxy base resin is an aliphatic epoxy.

17. The semiconductor device according to claim 1, wherein:
the sealing material further contains an inorganic filler or the curing agent is an acid anhydride curing agent.

18. The semiconductor device according to claim 1, wherein the semiconductor element includes one or more of a Si semiconductor element, a SiC semiconductor element, or a GaN semiconductor element.

19. A resin composition for sealing an electronic device comprising:
- an epoxy resin;
- a curing agent; and
- a phosphonic acid containing at least one phosphonyl group, —P(=O)(OH)2, and containing a carboxyl group and/or an amino group.

20. An electronic device sealed with the resin composition according to claim 19.

* * * * *